United States Patent [19]

Kawabata et al.

[11] Patent Number: 4,947,046

[45] Date of Patent: Aug. 7, 1990

[54] METHOD FOR PREPARATION OF RADIOGRAPHIC IMAGE CONVERSION PANEL AND RADIOGRAPHIC IMAGE CONVERSION PANEL THEREBY

[75] Inventors: Katuichi Kawabata, Yokohama; Kuniaki Nakano, Hachioji, both of Japan

[73] Assignee: Konica Corporation, Tokyo, Japan

[21] Appl. No.: 356,908

[22] Filed: May 25, 1989

[30] Foreign Application Priority Data

May 27, 1988 [JP] Japan ................................ 63-129996

[51] Int. Cl.$^5$ .............................................. G21K 4/00
[52] U.S. Cl. .................................. 250/484.1; 250/486.1
[58] Field of Search ...................... 250/484.1 B, 486.1, 250/327.2

[56] References Cited

U.S. PATENT DOCUMENTS 4,769,549 9/1988 Tsuchino et al. ............... 250/486.1

Primary Examiner—Carolyn E. Fields
Attorney, Agent, or Firm—Finnegan, Henderson, Farabow, Garrett, and Dunner

[57] ABSTRACT

A method for preparing a radiographic image conversion panel and the panel prepared thereby is disclosed. In the method a vapor flow of photostimulable phosphor or its raw material is applied to a support at a particular angle of incidence with respect to the normal direction of the support.

20 Claims, 7 Drawing Sheets

METHOD FOR PREPARATION OF RADIOGRAPHIC IMAGE CONVERSION PANEL AND RADIOGRAPHIC IMAGE CONVERSION PANEL THEREBY

BACKGROUND OF THE INVENTION

The present invention relates to a preparation method for a radiographic image conversion panel using a photostimulable phosphor and a radiographic image conversion panel prepared by the method.

Radiographic images, such as X-ray images, are widely used for disease diagnosis and other purposes.

Recently, U.S. Pat. No. 3,859,527 and Japanese Patent O.P.I. Publication No. 12144/1980 each disclose a method of radiographic image conversion using a photostimulable phosphor in the presence of visible light or infrared rays as stimulating excitation light. These methods use a radiographic image conversion panel comprising a support and a layer of photostimulable phosphor formed thereon. The layer of photostimulable phosphor of this radiographic image conversion panel is irradiated with radioactive rays that passed through the subject to accumulate radiation energy according to the radiation permeability of each portion of the subject for forming a latent image (cumulative image); the layer of photostimulable phosphor is then scanned with stimulating excitation light to cause it radiate the radiation energy accumulated in each portion and convert it to light; an image is obtained on the basis of the light signal corresponding to the intensity of this light. The eventual image thus obtained may be reproduced as a hard copy or on CRT.

The radiographic image conversion panel having a layer of photostimulable phosphor, used for this method of radiographic image conversion, needs to produce images of good graininess and high sharpness, as well as to have high percent absorption of radiation and high photoconversion efficiency (hereinafter together referred to as "radiation sensitivity") similarly in the radiography using the conventions fluorescent screen.

Recently a conversion panel containing no binding agent was developed. Thought this panel is advantageous because it has high packing density of phosphor and therefore has a satisfactory sensitivity with a thin phosphor layer, there is certain room to improve image sharpness. The sharpness depends on the directional characteristics of the stimulating excitation light introduced into the phosphor layer.

In the light of this drawback, the following methods have recently been proposed one by one with the aim of improving image sharpness:

(1) The method in which, as shown in FIG. 10, fine prismatic blocks 94 are prepared by depositing a photostimulable phosphor 93 on a support 92 having a fine rugged pattern (tiles etc.) 91 to form gaps 95 among the prismatic blocks 94 (Japanese Patent O.P.I. Publication No. 142497/1986).

(2) The method in which, as shown in FIG. 11, gaps 105 formed among blocks 104 obtained by depositing a photostimulable phosphor 103 on a support 102 having a fine rugged pattern 101 are grown by shock treatment (Japanese Patent O.P.I. Publication No. 142500/1986). Note that 106 is a protective layer.

(3) The method in which, as shown in FIG. 12, gaps 113 are formed in a layer of photostimulable phosphor 112 deposited on the upper surface of a support 111 from the upper face of the layer of the phosphor (Japanese Patent O.P.I. Publication No. 39797/1987). Note that 114 is a protective layer.

(4) The method in which, as shown in FIG. 13, a layer of photostimulable phosphor 123 having hollows 122 is formed on the upper surface of a support 121 by atmospheric vapor deposition, and this is followed by heat treatment etc. to grow the hollows 122 to form gaps (Japanese Patent O.P.I. Publication No. 110200/1987). Note that 124 is a protective layer.

However, the method of (1) above is faulty in that the process of forming the fine rugged pattern 91 on the support 92 is complicated and there is a limitation on fining the pattern 91, which in turn limits image sharpness.

The method of (2) requires a process of shock treatment, leading to an additional cost of production.

The methods (3) and (4) are both faulty in that uniformization of gap density on panels of large area is difficult, and a process of shock treatment is necessary as in the method of (2).

SUMMARY OF THE INVENTION

A purpose of the present invention, intended for a solution to these problems, is to provide a radiographic image conversion panel with an improved sensitivity and graininess and a high sharpness (directional characteristics of the stimulating excitation light and photostimulated luminescence). Another purpose of the invention is to provide a radiographic image conversion panel that can be produced easily and stably.

A further purpose is to provide a method for producing such panels.

A radiographic image conversion panel of the present invention comprises a support and at least one layer of photostimulable phosphor formed thereon by vapor deposition, and said layer of photostimulable phosphor comprises separate, oblong, prismatic crystals at a inclination with respect to the normal of the support.

The gaps among said oblique, oblong, prismatic crystals is preferably packed with a substance of high reflectance or high absorption of light.

In producing the panel, a vapor flow of the photostimulable phosphor is applied to the support at a particular angle of incidence with the normal direction of the support.

DETAILED DESCRIPTION OF THE INVENTION

The present invention is described in detail below.

Figure 1:
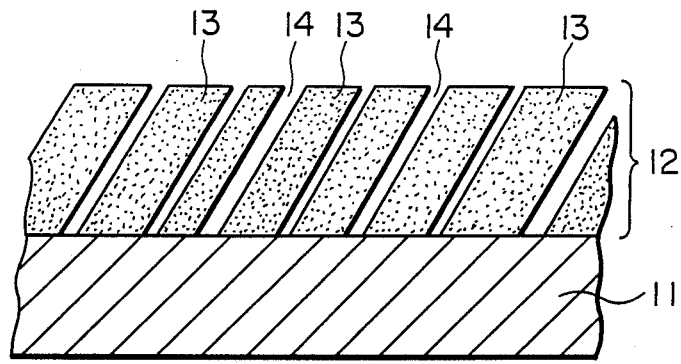
FIG. 1 shows a sectional view of the panel of the present application.

FIG. 1 shows a partial section of the radiographic image conversion panel (also simply referred to as conversion panel) of the present invention.

In the figure, 11 is a support, and 12 is a layer of photostimulable phosphor formed on the support 11. The layer of photostimulable phosphor 12 comprises separate, oblong, prismatic crystals 13 grown by vapor deposition (oblique vapor deposition) at a particular angle $\theta_2$ with the normal direction R of the support 11, and fine gaps 14 are provided at the above angle among the prismatic crystals 13.

Figure 2:
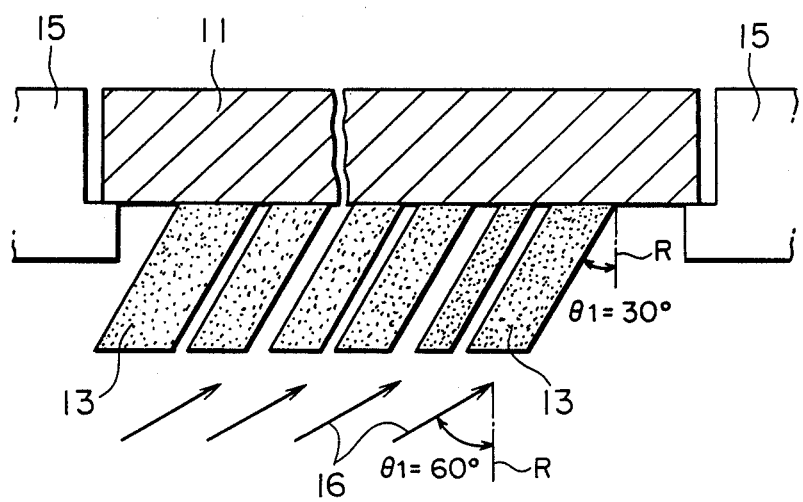
FIG. 2 shows an explanatory diagram of the vapor deposition process.

For producing the separate, oblong, prismatic crystals 13 (i.e. fine gaps 14), a vapor flow of the photostimulable phosphor (indicated by arrows) is applied to the support 11 held by the support holder 15 at a particular angle of incidence $\theta_2$ with the normal direction R of the support 11, as shown in FIG. 2. For example, when the vapor flow of photostimulable phosphor 16 is deposited at an angle of incidence of $\theta_2=60°$, the angle of growth of the crystals 13 ($\theta_1$) is about 30°, and the shaded portions produced in the back of the crystals during their growth become fine gaps 14.

In this case, for improving MTF (image modulation transfer function), it is preferable that the width of prismatic crystal 13 be about 1 to 50 $\mu$m, more preferably 1 to 30 $\mu$m. That is, when the prismatic crystal 13 is slenderer than 1 $\mu$m, the MTF decreases because the stimulating excitation light is scattered by the prismatic crystals; also when the prismatic crystal 13 is wider than 50 $\mu$m, the directivity of the stimulating excitation light decreases, thus causing MTF reduction.

Also, the width of gaps 14 should preferably be less than 30 $\mu$m, more preferably less than 5 $\mu$m. When the width of gaps 14 exceeds 30 $\mu$m, the packing ratio of the phosphor in the layer of phosphor becomes low, leading to sensitivity reduction.

Figure 3A:
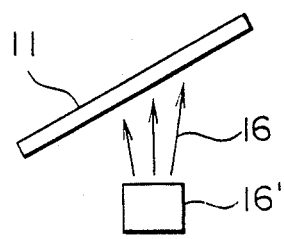
FIGS. 3(a)–(c) show explanatory diagrams of the state of oblique vapor deposition.
Figure 3B:
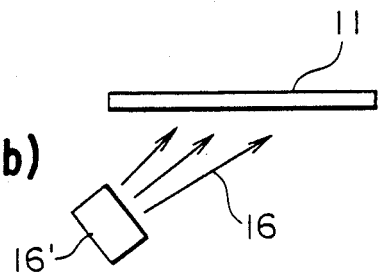
Figure 3C:
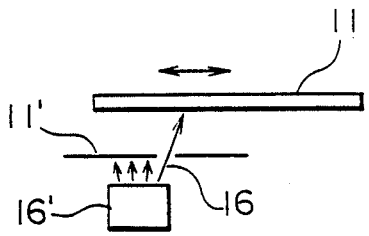
Figure 4:
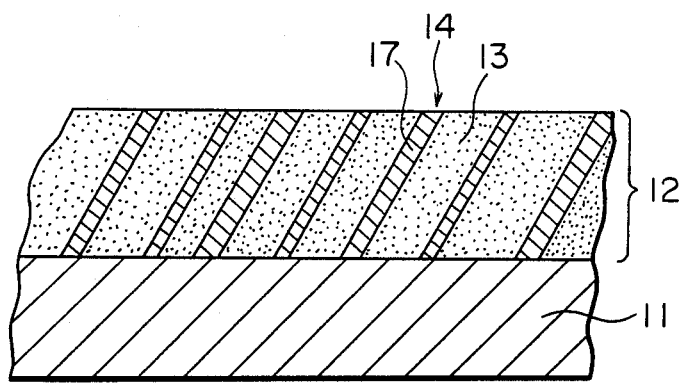
FIG. 4 shows a sectional view of another mode of the panel of the present application.

Methods of growing crystals of photostimulable phosphor on the support 11 by applying a vapor flow 16 of the photostimulable phosphor to the support 11 at an angle of incidence $\theta_2$ include the method in which the support is inclined with respect to the crucible 16' containing a source of evaporation as shown in FIG. 3(a), the method in which the support 11 is placed horizontally and the evaporation surface of the crucible 16' containing a source of evaporation is inclined as shown in FIG. 3(b), and the method in which the support 11 and the evaporation surface of the crucible 16' are both placed horizontally and the oblique component alone of the vapor flow 16 is deposited while being regulated using a regulatory material 11'. In these cases, it is appropriate to separate the support 11' and the crucible 16' at the shortest distance of about 10 to 60 cm according to the average flight distance of the photostimulable phosphor. Note that the width of the above-mentioned prismatic crystal 13 tends to decrease as the temperature of the support 11 decreases.

Although there is no particular limitation on the choice of the angle of growth $\theta_1$, as long as it is greater than 0° and smaller than 90°, it is preferably between 10° and 70° more preferably between 20° and 55°. The angle of incidence $\theta_2$ may be chosen between 20° and 80°, or 40° and 70° to ensure the angle of growth $\theta_1$ being between 10° and 70°, or 20° and 55° respectively. When the angle of growth $\theta_1$ it is too great, the layer becomes brittle. It is of course possible, even when the angle is too great, to strengthen the layer by packing gaps 14 formed among the prismatic crystals with a packing material 17, such as a substance of high reflectivity or high absorption of light.

The angle of growth $\theta_1$ of the respective primatic crystal is preferably within the range of +5° with respect to an average angle $\theta_1$ of the crystals in a panel.

The object of packing fine gaps 14 with packing material 17 is to strengthen the layer of photostimulable phosphor and almost completely prevent the transversal diffusion of the stimulating excitation light that goes into the layer of photostimulable phosphor. Accordingly, since the stimulating excitation light goes through the above-mentioned separate, oblong, prismatic crystals 13 and reaches the surface of the support while repeating reflection in the interface of gaps 14, it noticeably upgrades the sharpness of images produced by photostimulated luminescence.

The substance of high reflectivity of light reflects light emitted from the photostimulable phosphor, whose wavelength is 500-900 nm, specifically 600-800 nm, more than 70% regarding a standard white plate of magnesium oxide as 100%. The substance of high absorption of light absorbs the light emitted from the stimulable phosphor, and its transmittance is preferably less than 70% measured by means of a cell having a thickness of 10 mm regarding air as 100%. Both the reflectivity and the transmittance are measured by an optical densitometer model 557, made by Hitachi.

Referring to the above-mentioned packing material 17, examples of substances of high reflectance include aluminum, magnesium, silver, indium, and other metals, a white pigment, a green or red coloring agent. The white pigment respects emitted light. Examples thereof is shown below. Examples of substances of high absorption include carbon, chromium oxide, nickel oxide, and iron oxide; and a blue coloring agent.

Of these substances carbon absorbs light emitted from the photostimulable phosphor.

The pigment should preferably be of a high reflectance for photostimulated luminescence; white pigment is especially preferable from this viewpoint. Examples of white pigments include $TiO_2$ (anatase type, rutile type), MgO, $2PbCO_3 \cdot Pb(OH)_2$, $BaSO_4$, $Al_2O_3$, $M^{II}FX$ (at least one of $M^{II}$ Ba, Sr and Ca; X represents at least one of C'l and Br), $CaCO_3$, ZnO, $Sb_2O_3$, $SiO_2$, $ZrO_2$, $Nb_2O_5$, lithopone ($BaSO_4 + ZnS$), magnesium silicate, basic lead siliconsulfate, basic lead phosphate, and aluminum silicate. Since these white pigments have a strong hiding power and great refractive index, they easily scatter photostimulated luminescence by reflection or refraction, thus permitting noticeable improvement of the sensitivity of the obtained radiographic image conversion panel.

Any organic or inorganic coloring material can be used. Examples of organic coloring materials include Zapon Fast Blue 3G (produced by Hoechst), Estrol Brill Blue N-3RL (produced by Sumitomo Chemical), D & C Blue No. 1 (produced by National Aniline), Spirit Blue (produced by Hodogaya Chemical), Oil Blue No. 603 (produced by Orient), Kiton Blue A (produced by Chiba-Geigy), Aizen Catiron Blue GLH (produced by Hodogaya Chemical), Lake Blue AFH (produced by Kyowa Sangyo), Primocyanine 6GX (produced by Inabata & Co.), Brill Acid Green 6BH (produced by Hodogaya Chemical), Cyan Blue BNRCS (produced by Toyo Ink), and Lionoil Blue (produced by Toyo Ink). Mention may also be made of organic metal complex salt coloring materials such as Color Index Nos. 24411, 23160, 74180, 74200, 22800, 23150, 23155, 24401, 14830, 15050, 15760, 15707, 17941, 74220, 13425, 13361, 13420, 11836, 74140, 74380, 74350, and 74460. Examples of inorganic coloring materials include ultramarine, cobalt blue, cerulean blue, chromium oxide, and $TiO_2$-ZnO-CoC-NiO pigments.

The packing substance is introduced into the fine gaps whose width is preferably 1–30 μm. The substance of fine particles having a diameter of several hundred micrometers may be introduced physically without previous processing. In case that the substance has lower melting point, it may be heated and introduced. The substance may be permeated into the gap when dissolved or dispersed in a liquid having suitable viscosity and is deposited by evaporation or modification by heating. The substance may be introduced into the gap by a gas phase deposition method.

The photostimulable phosphor to be used as the above-mentioned source of evaporation is fed into a crucible after being uniformly dissolved or being shaped using a press or hot press. At that time, it is preferable to conduct degassing. The photostimulable phosphor is evaporated from the source of evaporation by scanning with an electron beam emitted from an electron gun, but other methods may be used to evaporate the phosphor.

The source of evaporation should not necessarily be a photostimulable phosphor, and may be a mixture of starting materials for a photostimulable phosphor.

An activator may be doped on the basic substance later. For example, Tl as an activator may be doped after vapor deposition of the basic substance RbBr alone. This is because satisfactory doping is possible even when the layer is thick, since the crystals are separate from each other, and MTF does not decrease since crystal growth is unlikely to occur.

The activator may be doped into the prepared basic substance by a heat-diffusion or ion plating method.

For improving the adhesion between the support 11 and the layer of photostimulable phosphor 12 to be adhered to the surface of the support, an adhesive layer or a reflection layer or absorption layer for stimulating excitation light and/or photostimulated luminescence may be previously prepared on the surface of support 11 as needed.

Gas phase growth of the layer of photostimulable phosphor 12 can be achieved by the vapor deposition method, the sputtering method and the CVD method.

In the vapor deposition method, the support is placed in a vapor deposition apparatus; the apparatus is then degassed to a degree of vacuum of about $10^{-6}$ Torr; at least one layer of photostimulable phosphor as described above is heated and evaporated by the resistance heating method, the electron beam method, or other method to obliquely deposit the photostimulable phosphor on the surface of the support to the desired thickness. As a result, a layer of photostimulable phosphor containing no binder is formed; it is also possible to form a layer of photostimulable phosphor in two or more repetitions of the vapor deposition procedure. It is also possible to achieve vapor deposition using more than one resistance heaters or electron beams. In the vapor deposition method, it is also possible to vapor deposit material for photostimulable phosphor using more than one resistance heaters or electron beams to synthesize the desired photostimulable phosphor on the support and form a layer of photostimulable phosphor at a time. In the vapor deposition method, the subject of deposition may be cooled or heated during vapor deposition as needed. Heat treatment may be conducted on the layer of photostimulable phosphor after completion of vapor deposition.

In the sputtering method, the support is placed in a sputtering apparatus; the apparatus is then degassed to a degree of vacuum of about $10^{-6}$ Torr as in the above vapor deposition method; an inert gas such as Ar or Ne, as the sputtering gas, is introduced into the apparatus to a gas pressure of $10^{-3}$ Torr. Oblique sputtering is then conducted on the photostimulable phosphor as the target to obliquely deposit the photostimulable phosphor on the surface of the support to the desired thickness. In this sputtering process, it is possible to form a layer of photostimulable phosphor in two or more repetitions as in the vapor deposition method, and also possible to form it by simultaneous or sequential sputtering of more than one targets of different photostimulable phosphors. Furthermore, in the sputtering method, it is possible to simultaneously or sequentially sputter more than one materials for photostimulable phosphor as the targets to synthesize the desired photostimulable phosphor on the support and form a layer of photostimulable phosphor at a time. Reactive sputtering may also be conducted in the presence of a gas such as $O_2$ or $H_2$ as introduced as needed. In addition, the subject of deposition in the sputtering method may be cooled or heated as needed during sputtering. The photostimulable layer may also be subjected by heat treatment after sputtering.

In the CVD method, a layer of photostimulable phosphor containing no binder is obtained on the support by decomposing an organic metal compound containing the desired photostimulable phosphor or a material therefor with heat, high frequency electric power, or other energy source. The method permits gas phase growth of a layer of photostimulable phosphor to separate, oblong, prismatic crystals at a particular inclination with respect to the normal direction of the support.

Although the thickness of the layer of photostimulable phosphor of the radiographic image conversion panel of the present invention varies with the radiation sensitivity of the desired radiographic image conversion panel, the type of the photostimulable phosphor, and other factors, it is preferable to choose it in the range of 10 μm to 1000 μm, more preferably in the range of 20 μm to 800 μm.

Figure 5:
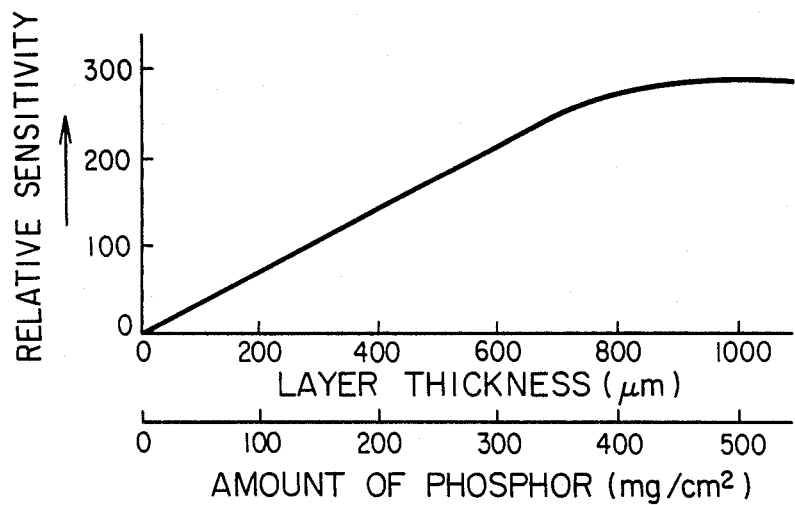
FIG. 5 shows a graph of the relationship between the thickness of the layer of photostimulable phosphor, as well as the amount of adhesion, and relative radiation sensitivity, in the panel of the present invention.
Figure 9A:
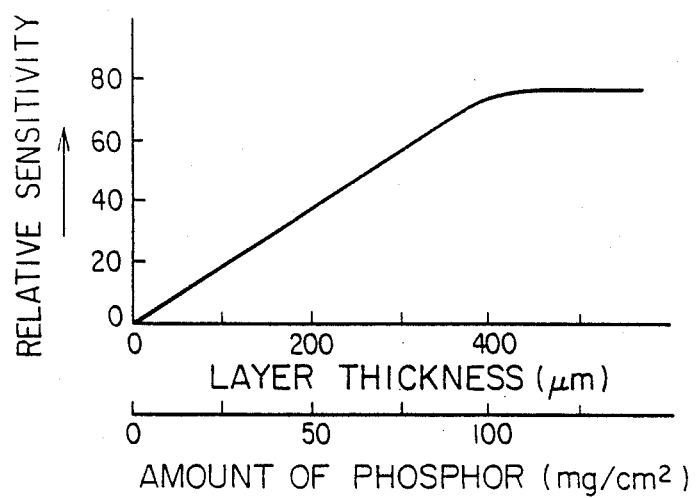
FIG. 9(a) shows a graph of the relationship between the thickness of the layer of photostimulable phosphor, as well as the amount of adhesion, and relative radiation sensitivity, in a conventional panel.
Figure 9B:
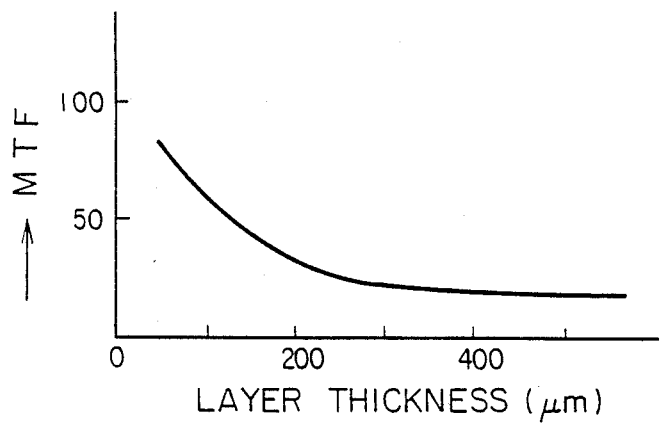
FIG. 9(b) shows a graph of the relationship between the thickness of the layer of photostimulable phosphor and special frequency (MTF) in a conventional panel.
Figure 10:
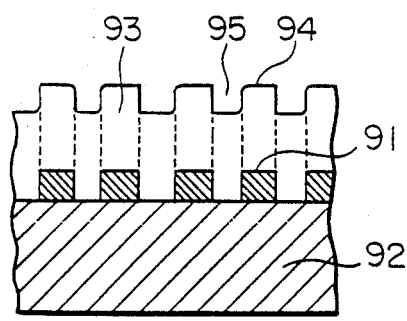
FIGS. 10 through 13 show sectional views of conventional panels.
Figure 11:
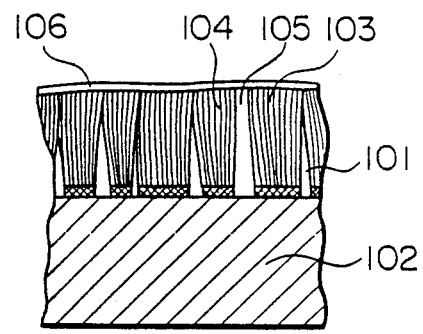
Figure 12:
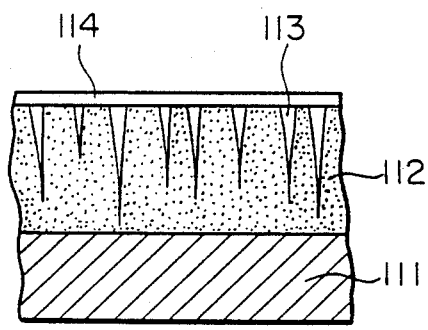
Figure 13:
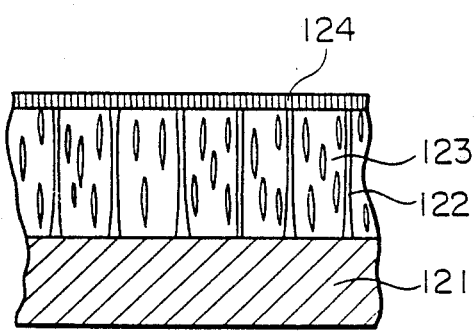

FIG. 5 shows the relationship between the thickness of the layer of photostimulable phosphor of the radiographic image conversion panel of the present invention, as well as the amount of adhered photostimulable phosphor corresponding to the layer thickness, and radiation sensitivity. As is evident in comparison with FIG. 9, which shows characteristics of a conventional panel, the layer of photostimulable phosphor of the radiographic image conversion panel of the present invention gives an adhesion amount (packing ratio) of photostimulable phosphor two times that of the conventional radiographic image conversion panel having binder, since the layer contains no binder; in the radiographic image conversion panel of the present invention, an improved radioabsorption ratio per unit thickness of the layer of photostimulable phosphor is obtained, leading to improvement of image graininess as well as higher radiation sensitivity, in comparison with the conventional radiographic image conversion panel.

In addition, containing no binder, the layer of photostimulable phosphor of the radiographic image conversion panel of the present invention has an excellent directional characteristics and is thus highly permeable for stimulating excitation light and photostimulated luminescence; therefore, it permits increasing the layer thickness over that of conventional radiographic image conversion panels.

Furthermore, as stated above, the layer of photostimulable phosphor of the radiographic image conversion panel of the present invention has excellent directivity, thus mitigating scattering of stimulating excitation light in the layer of photostimulable phosphor and noticeably improving image sharpness.

Various macromolecular materials, glass, metals, and other materials are used for the support for the present invention. Examples of preferable supports include plastic films such as cellulose acetate films, polyester films, polyethylene terephthalate films, polyamide films, polyimide films, triacetate films and polycarbonate films; metal sheets such as aluminum sheets, iron sheets and copper sheets; and metal sheets having a coating layer of any one of oxides of these metals. The surface of these supports may be smooth, or may be matted to improve adhesion with the layer of photostimulable phosphor.

Figure 6A:
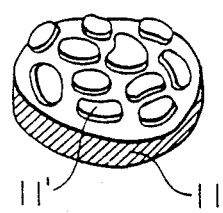
FIGS. 6(a) and (b) respectively show a partial oblique view of a support having a structure in which tile-like plates are arranged, and a sectional view of the support on which oblique vapor deposition has been conducted.
Figure 6B:
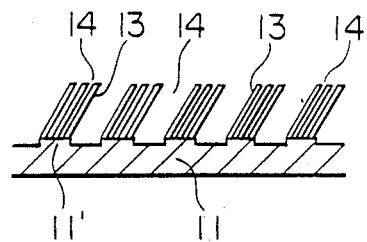

FIG. 6 shows a partial oblique view of the surface of a support and a section showing the state of deposition of a layer of photostimulable phosphor on the surface. As seen in FIG. 6(a), the support 11 has a surface structure in which separate, tile-like plates 11' are arranged. If oblique vapor deposition is conducted on the surface of the support 11, the layer of photostimulable phosphor 12 will be formed so that prismatic crystals 13 are isolated from each other at short intervals by gaps 14 and obliquely deposited while the outline of tile-like plates 11' is maintained by gaps 14', as seen in FIG. 7(b), and image sharpness will further improve.

Although the thickness of the support varies with the material used and other factors, it is normally 80 μm to 3 mm, and from the viewpoint of easy handling, it is preferably 200 μm to 2 mm.

In the radiographic image conversion panel of the present invention, a protective layer (not illustrated) for physical or chemical protection of the layer of photostimulable phosphor on the face opposite the face on which the support is laid. This protective layer may be formed by applying and drying a solution of a film-forming macromolecular substance in an appropriate solvent, as disclosed in Japanese Patent O.P.I. Publication No. 42500/1984, or may be adhered by applying an appropriate binder on one face of a film of a macromolecular substance.

Examples of materials for the protective layer include cellulose derivatives such as cellulose acetate, nitrocellulose and methylcellulose, polymethyl methacrylate, polyvinyl butyral, polyvinyl formal, polycarbonate, polyester, polyethylene terephthalate, polyethylene, polyvinylidene chloride and nylon. It is normally preferable that the film thickness of these protective layers be about 1 μm to 2000 μm.

Figure 7:
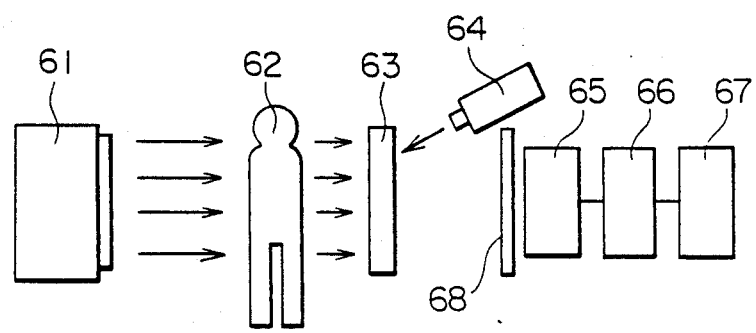
FIG. 7 shows a schematic diagram of the apparatuses for radiographic image conversion.
Figure 8A:
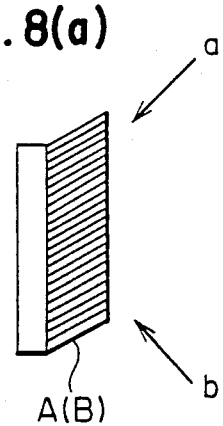
FIGS. 8(a) and (b) show explanatory diagrams showing the directions of incidence of stimulating excitation light.
Figure 8B:
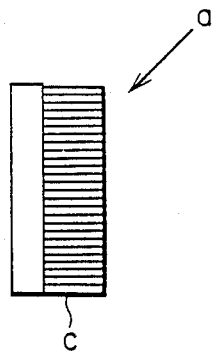

The radiographic image conversion panel of the present invention, when used for the method of radiographic image conversion schematized in FIG. 7, provides excellent image sharpness, graininess and sensitivity.

In FIG. 7, 61 is a radiation generator; 62 is a subject; 63 is a panel of the present application; 64 is a source of stimulating excitation light; 65 is a photoelectric converter that detects the photostimulated luminescence radiated by the panel 63; 66 is an apparatus that reproduces the signals detected by the photoelectric converter 65 as images; 67 is a display apparatus for the reproduced images; 68 is a filter that separates stimulating excitation light and photostimulated luminescence and allow the photostimulated luminescence alone to pass through it. Note that the photoelectric converter 65 and other apparatuses represented by a greater number are not limited to the above descriptions, as long as they are capable of reproducing the optical information from the panel of the present applications 63 as images in any way.

The radiation from the radiation generator 61 passes through the subject 62 and goes into the panel of the present applications 63. The incident radiation is absorbed in the layer of photostimulable phosphor of the panel of the present application 63; its energy is accumulated therein and a cumulative image of the radiation transmission image is formed. This cumulative image is then excited by the stimulating excitation light from the source of stimulating excitation light 64 to emit photostimulated luminescence. Since the layer of photostimulable phosphor of the panel of the present application 63 contains no binder and thus shows high directivity, diffusion of stimulating excitation light in the layer of photostimulable phosphor is suppressed during scans with the above stimulating excitation light.

Since the intensity of the radiated photostimulated luminescence is in proportion to the amount of accumulated radiation energy, it is possible to observe the radiation transmission image of the subject 62 by photoelectrically converting this optical signal using the photoelectric converter 65, e.g. a photomultiplier, reproducing it as an image using the image reproducer 66, and displaying it on the image display 67.

The above-mentioned "photostimulable phosphor" means a phosphor which emits photostimulated luminescence corresponding to the amount of the irradiated starting light or high energy radiation in response to the optical, thermal, mechanical, chemical electric, or other stimulation (stimulating excitation) following the irradiation of the starting light or high energy radiation. However, from the viewpoint of practical application, it should be a phosphor which emits photostimulated luminescence in response to stimulating excitation light whose wavelength is preferably more than 500 nm. Examples of the photostimulable phosphor for the radiographic image conversion panel of the present invention include the phosphor represented by $BaSO_4$: Ax, disclosed in Japanese Patent O.P.I. Publication No. 80487/1973, the phosphor represented by $MgSO_4$: Ax, disclosed in Japanese Patent O.P.I. Publication No. 80488/1973, the phosphor represented by $SrSO_4$: Ax, disclosed in Japanese Patent O.P.I. Publication No.

80489/1973, the phosphor obtained by adding at least one of Mn, Dy, and Tb to $Na_2SO_4$, $CaSO_4$, $BaSO_4$ etc., disclosed in Japanese Patent O.P.I. Publication No. 29889/1976, the phosphor such as BeO, LiF, $MgSO_4$ and $CaF_2$, disclosed in Japanese Patent O.P.I. Publication No. 30487/1977, the phosphors represented by $Li_2B_4O_7$: Cu, Ag, disclosed in Japanese Patent O.P.I. Publication No. 39277/1978, the phosphors such as $Li_2O.(B_2O_2)x$: Cu and $Li_2O.(B_2O_2)x$: Cu, Ag, disclosed in Japanese Patent O.P.I. Publication No. 47883/1979, the phosphors represented by SrS: Ce, Sm, SrS: Eu, Sm, $La_2O_2S$: Eu, Sm, or (Zn, Cd)S: $Mn_x$, disclosed in U.S. Pat. No. 3,859,527. Mention may also be made of the ZnS: Cu, Pb phosphor disclosed in Japanese Patent O.P.I. Publication No. 12142/1980, the barium aluminate phosphor represented by the formula $BaO.Al_2O_3$: Eu, and the alkaline earth metal silicate phosphor represented by the formula $M^{II}O.xSiO_2$: A.

Examples further include the alkaline earth fluoride halide phosphor represented by the formula $(Ba_{1-x-y}Mg_x Ca_y)FX$: $Eu^{2+}$, disclosed in Japanese Patent O.P.I. Publication No. 12143/1980, the phosphor represented by the formula LnOX: $xA_1$ disclosed in Japanese Patent O.P.I. Publication No. 12144/1980 the phosphor represented by a formula $(Ba_{1-x}M^{II}x)FX$: yA, disclosed in Japanese Patent O.P.I. Publication No. 121451/1980, the phosphor represented by a formula BaFX: xCe, yA, disclosed in Japanese Patent O.P.I. Publication No. 84389/1980, the rare earth element activated divalent metal fluorohalide phosphor represented by the formula $M^{II}FX.xA$: yLn, disclosed in Japanese Patent O.P.I. Publication No. 160078/1980 the phosphors represented by the formula ZnS: A, CdS: A, (Zn, Cd)S: A, X or Cds: A, X, the phosphor represented by any one of the formulas

$xM_3 (PO_4)_2.NX_2$: yA and $M_3(PO_4)_2$: yA, disclosed in Japanese Patent O.P.I. Publication No. 38278/1984, the phosphors represented by any one of the formulas $nReX_3.mAX'_2$: xEu and $nReX_3.mAX'_2$: xEu, ySm, disclosed in Japanese Patent O.P.I. Publication No. 155487/1984, the alkali halide phosphor represented by the formula $M^IX.aM^{II}X'_2.bM^{III}X''_3$: cA, disclosed in Japanese Patent O.P.I. Publication No. 72087/1986, and the bismuth-activated alkali halide phosphor represented by the formula $M^IX$: xBi, disclosed in Japanese Patent O.P.I. Publication No. 228400/1986.

Particularly, alkali halide phosphors are preferable, since they can easily be prepared as a layer of photostimulable phosphor by vapor deposition, sputtering, or other method.

However, the photostimulable phosphor for the radiographic image conversion panel of the present invention is not limited to the above-mentioned phosphors; any phosphor can be used, as long as it emits photostimulated luminescence in response to irradiation of stimulating excitation light following irradiation of a radioactive ray.

EXAMPLE

The present invention is described in more detail by means of the following working example.

Figure 14:
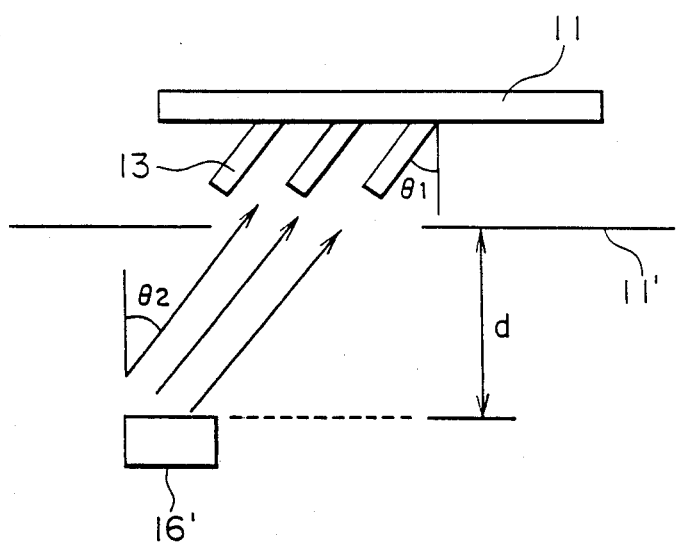

On the surface of the heated a crystallized glass support of a thickness of 1 m was vapor deposited an alkali halide phosphor (RbBr: 0.0006 Tl) at a condition shown in the Table with a vapor depositing apparatus shown in FIG. 14. In the FIG. 14, 11' is an aluminum slit which is placed at a distance of 60 cm from the source. The sample panels comprise a layer of photostimulable phosphor of a thickness of 300 μm having gap width of 1 μm.

Figure 15:
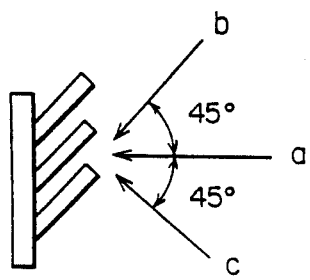
Figure 15:
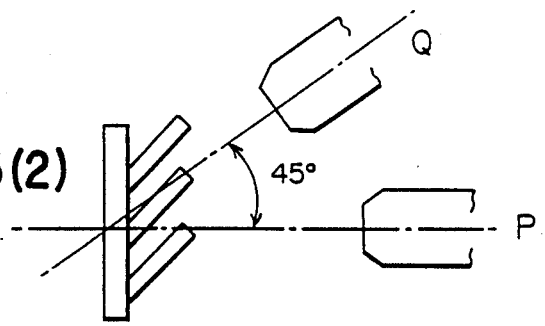

Panel L is a comparative sample. Stimulating excitation light was applied to each panel in the directions a and b (45°) and c as shown in FIG. 15 (1), and the direction of collecting emission of light was provided as shown in FIG. 15 (2); Relative sensitivity and sharpness were evaluated.

1. Relative sensitivity

Each test panel was irradiated with an X-ray of 80 KVp in an amount of 10 mR from 1.5 m, and then it was stimulated with a semiconductor laser (Wavelength: 780 nm, Power at the surface of panel: 40 mW, irradiating spot diameter: 100 μm). Intensity of emitted light was detected to give a relative sensitivity regarding the test number 3 as 100.

2. Sharpness

A CTF chart was attached to each panel for the evaluation of MTF. The panel was irradiated in the same way as mentioned above and emitted light was read out by stimulating laser light scanned along the CTF chart. Values T3 which is a summation of MTF values at 0.5, 1.0 and 2.0 lp/mm is shown in Table.

TABLE

| No. | Sample | Direction of excitation laser | Direction of reading | Angle of incident $\Theta_2$ | Angle of growth $\Theta_2$ | Temperature of heated support | Packing substance | MTF (T3) | Relative sensitivity | Width of crystal |
|---|---|---|---|---|---|---|---|---|---|---|
| 1 | A | a | Q | 25° | 15° | 100° C. | — | 190 | 91 | 5μ |
| 2 | B | a | Q | 45° | 23° | 100° C. | — | 195 | 99 | 5μ |
| 3 | C | a | Q | 60° | 30° | 100° C. | — | 200 | 100 | 5μ |
| 4 |   | b | P | 60° | 30° | 100° C. | — | 208 | 94 |   |
| 5 |   | c | P | 60° | 30° | 100° C. | — | 197 | 102 |   |
| 6 | D | a | Q | 70° | 46° | 100° C. | — | 199 | 97 | 5μ |
| 7 | E | a | Q | 75° | 58° | 100° C. | — | 194 | 95 | 5μ |
| 8 | F | a | Q | 80° | 69° | 100° C. | — | 189 | 90 | 5μ |
| 9 | G | a | Q | 65° | 32° | 250° C. | — | 194 | 104 | 10μ |
| 10 | H | a | Q | 65° | 33° | 350° C. | — | 186 | 101 | 16μ |
| 11 | I | a | Q | 60° | 30° | 100° C. | Lionol Blue SL *1 | 215 | 88 | 5μ |
| 12 | J | a | Q | 60° | 30° | 100° C. | Cyan Blue BNRCS *1 | 217 | 89 | 5μ |
| 13 | K | a | Q | 60° | 30° | 100° C. | Titan white *2 | 211 | 96 | 5μ |
| 14 | L | a | Q | 0 | 0 | 100° C. | — | 185 | 84 | 5μ |
| 15 |   | b | P | 0 | 0 | 100° C. | — | 182 | 88 | 5μ |

*1: Solved in toluen/ethanol mixture, deposited at 200° C.
*2: Anatase type T: $O_2$, average particle size 0.05 μm.

Panels of the present invention showed a sensitivity almost equal to that of comparison panel Lm, but gave improved sharpness. That is, panels having separate, oblong, prismatic crystals grown in an angle between 20° and 55° showed an advantage both in the sensitivity and the sharpness when the direction of collecting emitting light was provided in a direction closer to the angle of growth of the crystal. An advantage is obtained when the direction of incidence of stimulating excitation light is oblique. It is also evident that panels I, J and K of the present invention which contain a packing substance enhanced the effect of panel A of the present.

As stated above, since the radiographic image conversion panel of the present invention, comprising a support and a layer of photostimulable phosphor formed thereon by gas phase deposition, is characterized by growing, by gas phase deposition, said layer of photostimulable phosphor to separate, oblong, prismatic crystals at a particular angle with the normal of the support, scattering of the stimulating excitation light in the layer of photostimulable phosphor is mitigated and image sharpness increases.

In addition, since image sharpness does not decrease due to the increase in the thickness of the layer of photostimulable phosphor, sensitivity and graininess can be improved by increasing the layer thickness.

Moreover, a radiographic image conversion panel having excellent characteristics as described above can be produced cheaply and stably the simple means oblique vapor deposition.

Furthermore, since the present invention is also characterized by packing a substance of high reflectivity or high percent absorption of light or a coloring agent in the gaps among the prismatic crystals, the transversal diffusion of the stimulating excitation light which came into the layer of photostimulable phosphor can be almost completely prevented, and thus the sharpness of images formed by photostimulated luminescence can be noticeably increased.

What is claimed is:

1. A method for preparing a radiographic image conversion panel comprising a support and a layer of photostimulable phosphor formed thereon by a gaseous phase deposition method which comprises a step in which a vapor flow of photostimulable phosphor or raw material therefor is applied to the support at a particular angle of inclination with respect to the normal direction of the support.

2. A method of claim 1, wherein the gaseous phase deposition method is one of a method of a vapor deposition, sputtering or CVD method.

3. A method of claim 1, wherein the particular angle is greater than 20° and smaller than 80°.

4. A method of claim 1, wherein the particular angle is greater than 40° and smaller than 70°.

5. A method of claim 1, wherein the photostimulable phosphor or the raw material therefor is alkali halide phosphor.

6. A radiographic image conversion panel comprising a support and a layer of photostimulable phosphor formed thereon, said layer of photostimulable phosphor comprising separate, oblong, prismatic crystals formed at particular inclination with respect to the normal direction of the support.

7. A radiographic image conversion panel of claim 6, wherein an angle of the particular inclination is between 10° and 70°.

8. A radiographic image conversion panel of claim 6, wherein an angle of the particular inclination is between 20° and 55°.

9. A radiographic image conversion panel of claim 6, wherein the width of the separate, oblong and prismatic crystals is between 1 and 50 $\mu$m.

10. A radiographic image conversion panel of claim 9, wherein the width of the separate, oblong and prismatic crystals is between 1 and 30 $\mu$m.

11. A radiographic image conversion panel of claim 6, wherein the photostimulable layer compises gaps between crystals.

12. A radiographic image conversion panel of claim 11, wherein the width of the gaps are smaller than 30 $\mu$m.

13. A radiographic image conversion panel of claim 11, wherein the width of the gaps are smaller than $\mu$m.

14. A radiographic image conversion panel of claim 11, wherein the gaps are filled with packaging material having high reflectance or high absorption of stimulating excitation light.

15. A radiographic image conversion panel of claim 14, wherein the packaging material is alumnium, magnesium, silver or indium.

16. A radiographic image conversion panel of claim 14, wherein the packaging material is carbon, chromium oxide, nickel oxide or iron oxide.

17. A radiographic image conversion panel of claim 14, wherein the packaging material having high reflectance is a white pigment.

18. A radiographic image conversion panel of claim 6, wherein the photostimulable phosphor is alkali halide phosphor.

19. A radiographic image conversion panel comprising a support and a layer of photostimulable phosphor formed thereon, said layer of photostimulable phosphor comprising separate, oblong, prismatic crystals formed at a particular inclination with respect to the normal direction of the support being grown by a gaseous phase deposition method in which a vapor flow of photostimulable phosphor or raw material therefor is applied to the support at a particular angle of inclination with respect to the normal direction of the support.

20. A radiographic image conversion panel of claim 19, wherein the gaseous phase deposition method is one of a method of a vapor deposition, sputtering or CVD method.

* * * * *

UNITED STATES PATENT AND TRADEMARK OFFICE
CERTIFICATE OF CORRECTION

PATENT NO.    : 4,947,046
DATED         : August 07, 1990
INVENTOR(S)   : Katuichi Kawabata et al.

It is certified that error appears in the above-identified patent and that said Letters Patent is hereby corrected as shown below:

Claim 13, Column 12, Line 29, insert "5" after --than--.

Signed and Sealed this

First Day of September, 1992

Attest:

DOUGLAS B. COMER

*Attesting Officer*    Acting Commissioner of Patents and Trademarks